United States Patent [19]

Shimoi

[11] Patent Number: 5,007,027
[45] Date of Patent: Apr. 9, 1991

[54] DATA PROTECTION SYSTEM IN A DATA PROCESSING SYSTEM

[75] Inventor: Hiroyuki Shimoi, Yokohama, Japan

[73] Assignee: Fujitsu Limited, Kawasaki, Japan

[21] Appl. No.: 349,310

[22] Filed: May 9, 1989

[30] Foreign Application Priority Data

May 16, 1988 [JP] Japan .................................. 63-118963

[51] Int. Cl.⁵ ................................................ G11C 5/14
[52] U.S. Cl. ..................................................... 365/229
[58] Field of Search ................................. 365/228, 229

[56] References Cited

U.S. PATENT DOCUMENTS

| | | | |
|---|---|---|---|
| 4,547,629 | 10/1985 | Corless | 365/229 |
| 4,712,196 | 12/1987 | Uesugi | 365/229 |
| 4,777,626 | 10/1988 | Matsushita et al. | 365/229 |

Primary Examiner—James W. Moffitt
Attorney, Agent, or Firm—Staas & Halsey

[57] ABSTRACT

A data protection system for protecting data stored in a memory in a data processing system having at least a channel system, a device controller and an external storage device. The data protection system includes a memory provided in the device controller which receives a power source voltage, and temporarily stores data to be transferred. A battery is connected to the power source and the memory, is charged by the power source when the power source is normal, and supplies a battery voltage to the memory when the power source is accidentally interrupted. A first voltage check circuit is connected to the battery, compares the battery voltage with a first reference voltage, and generates a battery error signal when the battery voltage is lower than the first reference voltage. A second voltage check circuit is connected to the battery; compares the battery voltage with a second reference voltage and generates a battery charging signal when the battery voltage lies between the first and second reference voltages. A control circuit selectively determines two modes-one mode being a write-back mode for transferring data from the memory to the external storage device after data is stored in the memory, and the other being a write-through mode for directly transferring data from the channel system directly to the external storage device when one or both of the battery error signal and the battery charging signal is input thereto.

10 Claims, 9 Drawing Sheets

DATA PROTECTION SYSTEM IN A DATA PROCESSING SYSTEM

BACKGROUND OF THE INVENTION

1. Field of the Invention

The present invention relates to a data protection system for a memory having a battery to protect the data stored in the memory from accidental power OFF. More particularly, it relates to a battery voltage protection system for protecting a non-volatile type memory provided in a device controller, for example, a disk controller, between a channel system and an external storage device in a data processing system.

2. Description of the Related Art

Recently, a non-volatile type memory having a battery back-up system, which can protect the data from accidental power OFF, is widely utilized in data processing systems. In this case, the battery must be always sufficiently charged to deal with an accidental power OFF. That is, if the battery is always sufficiently charged when the power supply is normal, it is possible to perform the back-up operation when the power source is accidentally interrupted.

Further, this memory is utilized for storing not only relatively unimportant data, for example, log data for recovering the system, but also relatively important data, for example, a user's data. Accordingly, the battery back-up system must operate precisely to protect the important data from an accidental power OFF so that it is necessary to always check the battery back-up function, One method, a so-called "patrol check" is known for checking the battery voltage. For example, Japanese Unexamined Patent Publication (Kokai) No. 58-146099 discloses a memory protection system utilizing this patrol check. In this system, the battery voltage is checked in such a way that it is compared with a reference voltage after the power source is disconnected. That is, in FIG. 4 of the reference, a switch is connected to a comparator when checking the battery voltage. In this case, the neutral point of the switch is connected to the common point of a diode and the battery in order to prevent the surge voltage caused by, the switching of the switch. A memory is also included. Although this system is advantageous for checking deterioration of the battery, it cannot protect the data stored in the memory since it cannot previously detect the accidental power OFF.

Japanese Unexamined Patent Publication (Kokai) No. 62-8212 also discloses a battery voltage detection circuit for a memory in a battery back-up system. This circuit comprises two comparators each having different reference voltages for comparing a battery voltage as shown in FIG. 1 of the reference. A display element lights when the battery voltage lies between the first and second reference voltages or is lower than the second reference voltage. In the latter case, the brightness of the display element is increased. The battery voltage is always checked in this circuit. Although this system is advantageous for checking for deterioration of the battery, it cannot protect the data stored in the memory since it can not previously detect an accidental power OFF.

Still further, Japanese Unexamined Patent Publication (Kokai) No. 56-103722 discloses a battery voltage detection system for detecting an abnormal state of the battery voltage. In FIGS. 1 and 2 of this reference include, a power source unit, a power control unit, a memory, a battery, a battery voltage detection unit, voltage comparators, terminals, a control unit and a display unit. The power control unit controls the power supply to the memory, and the battery voltage detection unit always supervises the battery voltage and detects abnormal states thereof. The battery voltage detection unit includes a plurality of comparators each having different reference voltages. A volatile type of memory is used as the memory.

SUMMARY OF THE INVENTION

The object of the present invention is to provide a data protection system for a memory, particularly, a non-volatile type memory, enabling the detection of deterioration of the battery and an insufficient charging state of the battery.

In accordance with the present invention, there is provided a data protection system for protecting the data stored in a memory having a memory unit for temporarily storing the data, a power source unit for supplying the power to the memory unit, and a battery charged by the power source and supplying a battery voltage to the memory unit when the power source is accidentally interrupted. The data protection system includes: a first voltage check circuit connected to the battery, compares the battery voltage with a first reference voltage and generates a battery error signal when the battery voltage is lower than the first reference voltage. A second voltage check circuit is connected to the battery and compares the battery voltage with a second reference voltage and generates a battery charging signal when the battery voltage lies between the first reference voltage and the second reference voltage.

Further, there is provided a data protection system for protecting the data stored in a memory provided in a device controller, and having a memory unit for temporarily storing the data, a power source unit for supplying the power to the memory unit, and a battery charged by the power source and supplying a battery voltage to the memory unit when the power source is accidentally interrupted. The data protection system includes: a first voltage check circuit connected to the battery, compares the battery voltage with a first reference voltage and generates a battery error signal when the battery voltage is lower than the first reference voltage. A second voltage check circuit is connected to the battery, compares the battery voltage with a second reference voltage and generates a battery charging signal when the battery voltage lies between the first reference voltage and the second reference voltage. A control circuit disconnects the memory from the disk controller when the battery error signal or the battery charging signal is input thereto, and the control circuit informs a battery error to a firmware based on the battery error signal.

Still further, there is provided a data protection system for protecting the data stored in a memory in a data processing system having at least a channel system, a device controller and an external storage device. The data protection system includes: a memory provided in the device controller supplied with a power source voltage from a power source for and temporarily storing data to be transferred. A battery is connected to the power source and the memory, and charged by the power source when the power source is normal, and supplies a battery voltage to the memory when the power source is accidentally interrupted. A first voltage check circuit is connected to the battery, compares the battery voltage with a first reference voltage and generates a battery error signal when the battery voltage is lower than the first reference voltage. A second voltage check circuit is connected to the battery, compares the battery voltage with a second reference voltage and generates a battery charging signal when the battery voltage lies between the first reference voltage and the second reference voltage. A control circuit selectively determines two modes, one mode being a write-back mode for transferring the data of the memory from the memory to the external storage device after the data is stored in the memory, and the other mode being a write-through mode for directly transferring the data from the channel system to the external storage device not through the memory when the battery error signal and/or the battery charging signal is input thereto.

DESCRIPTION OF THE PREFERRED EMBODIMENTS

Figure 1:
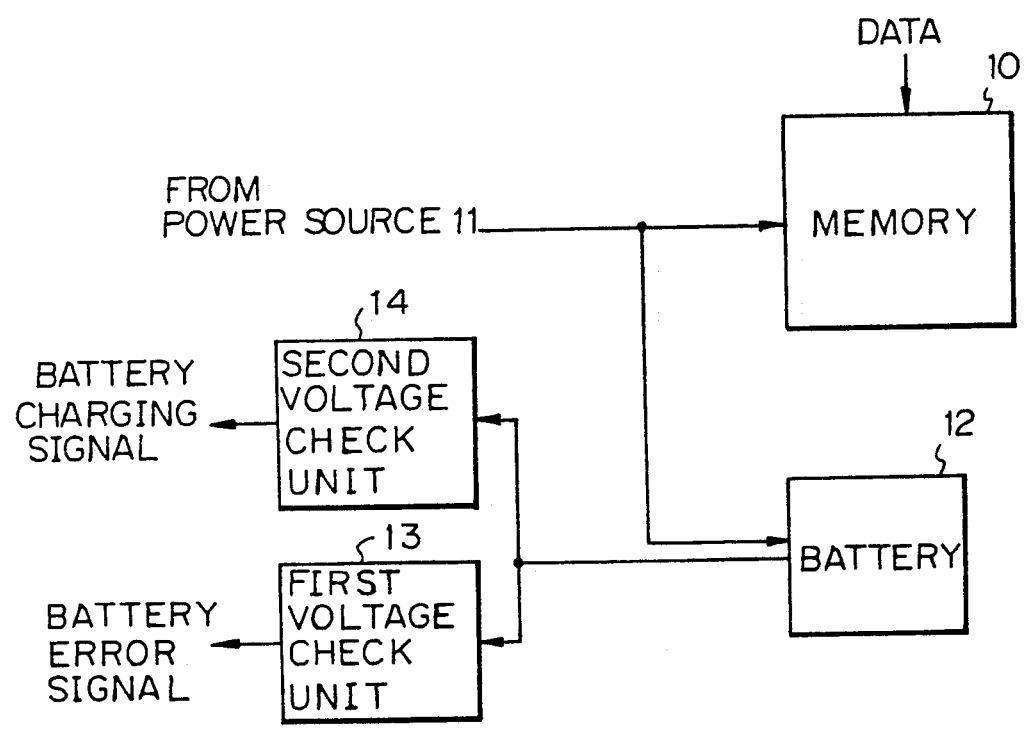
FIGS. 1 and 2 are a principle structures for explaining the present invention.
Figure 2:
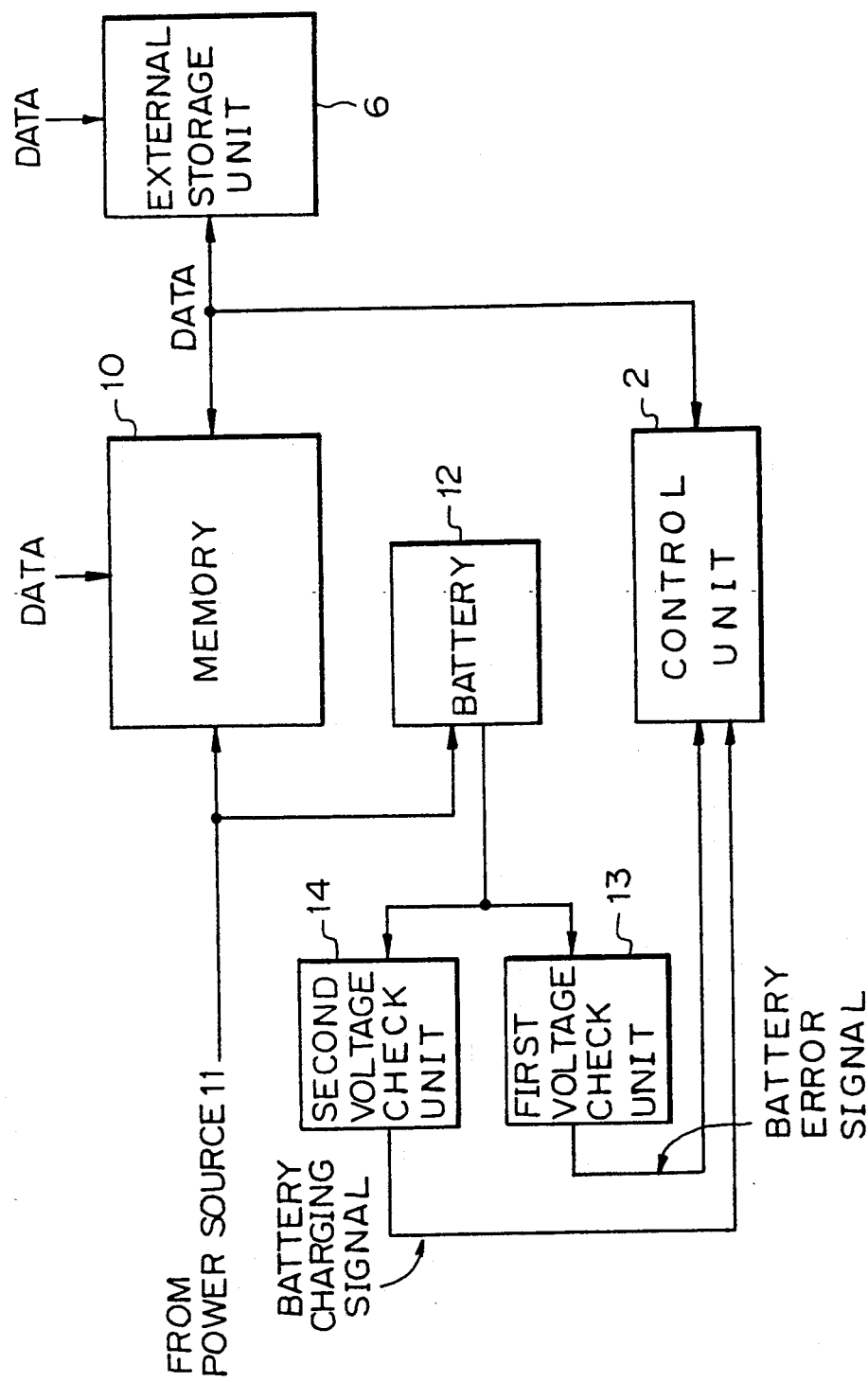

FIGS. 1 and 2 are principle structures for explaining the present invention. In FIG. 1, reference number 10 denotes a memory, for example, a non-volatile type memory, and 12 denotes a battery for supplying a voltage when the power source is accidentally interrupted. Further, reference numbers 13 and 14 denote first and second voltage check units for checking the output voltage of the battery 12 (referred to hereinafter as the battery voltage). The first voltage check unit 13 compares the battery voltage with a first reference voltage and generates a battery error signal BERR when the battery voltage is lower than the first reference voltage. The second voltage check unit 14 compares the battery voltage with a second reference voltage and generates a battery charging signal BCRG when the battery voltage lies between the first reference voltage and the second reference voltage.

Figure 8:
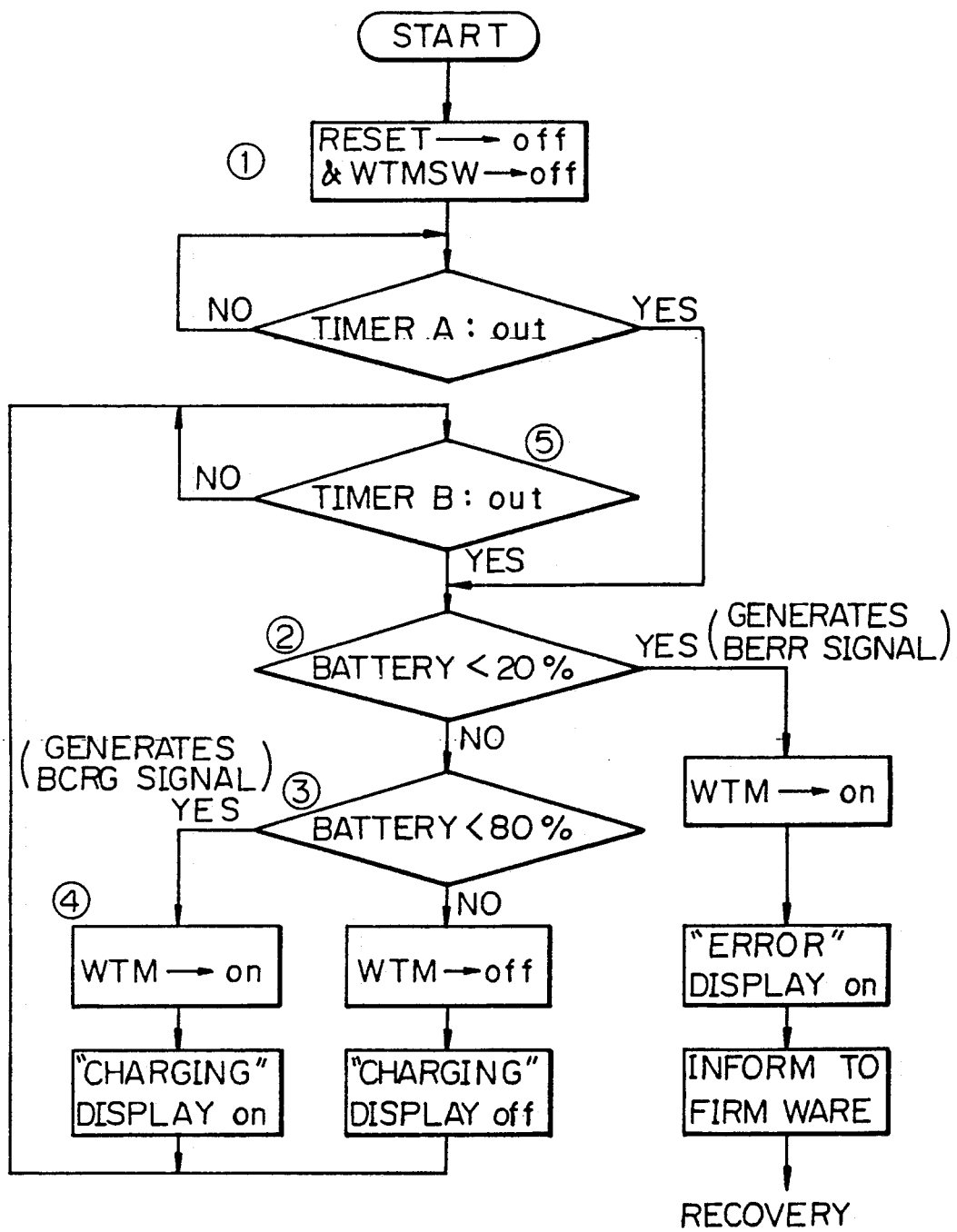
FIG. 8 is a flowchart for explaining the operation of the structure shown in FIGS. 5, 6 and 7.
Figure 10:
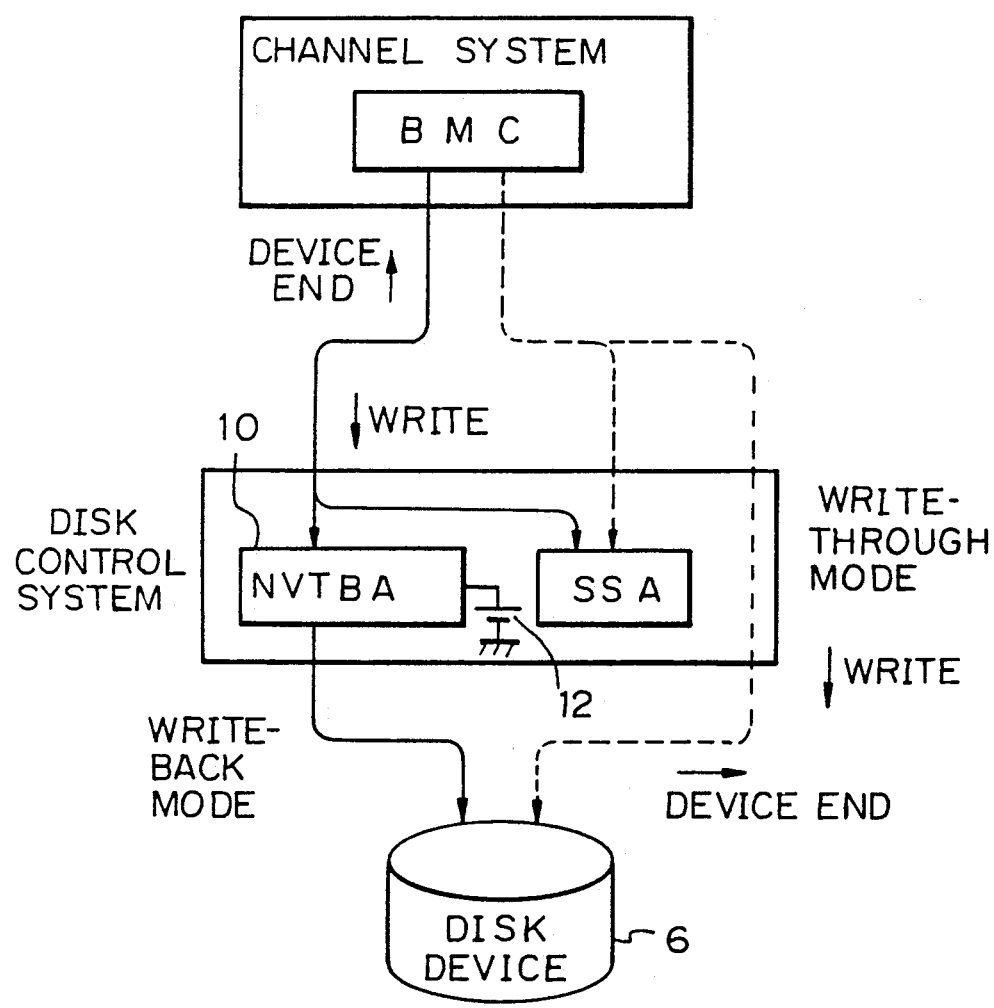
FIG. 10 is a schematic block diagram of a data processing system for explaining the present invention.

In FIG. 2, reference number 2 denotes a control unit for disconnecting the memory 10 from the device controller when the battery charging signal or the battery error signal is input thereto. Further, the control unit 2 informs firmware of the battery error state based on the battery error signal as shown in FIG. 8. When the memory 10 is disconnected from the device controller, an external storage device 6, for example, a disk device is directly accessed from a channel system as shown in FIG. 10.

Accordingly, the control unit 2 selectively initiates a write-back mode and a write-through mode. That is, in the write-back mode, the data temporarily stored in the memory 10 is transferred from the device controller to the external storage device 6, and in the write-through mode, the data is directly transferred from the channel system to the external storage device 6 (disk device) not through the memory 10 as shown in FIG. 10.

In the present invention, it is possible to easily detect whether the battery is in a deteriorated or insufficient charging state. If the battery is in a deteriorated state, it must be changed to a new battery. If the battery is in an insufficient state, the use of the battery is stopped and the write-through mode is initiated between the channel system and the external storage device 6 based on the charging signal.

Figure 3:
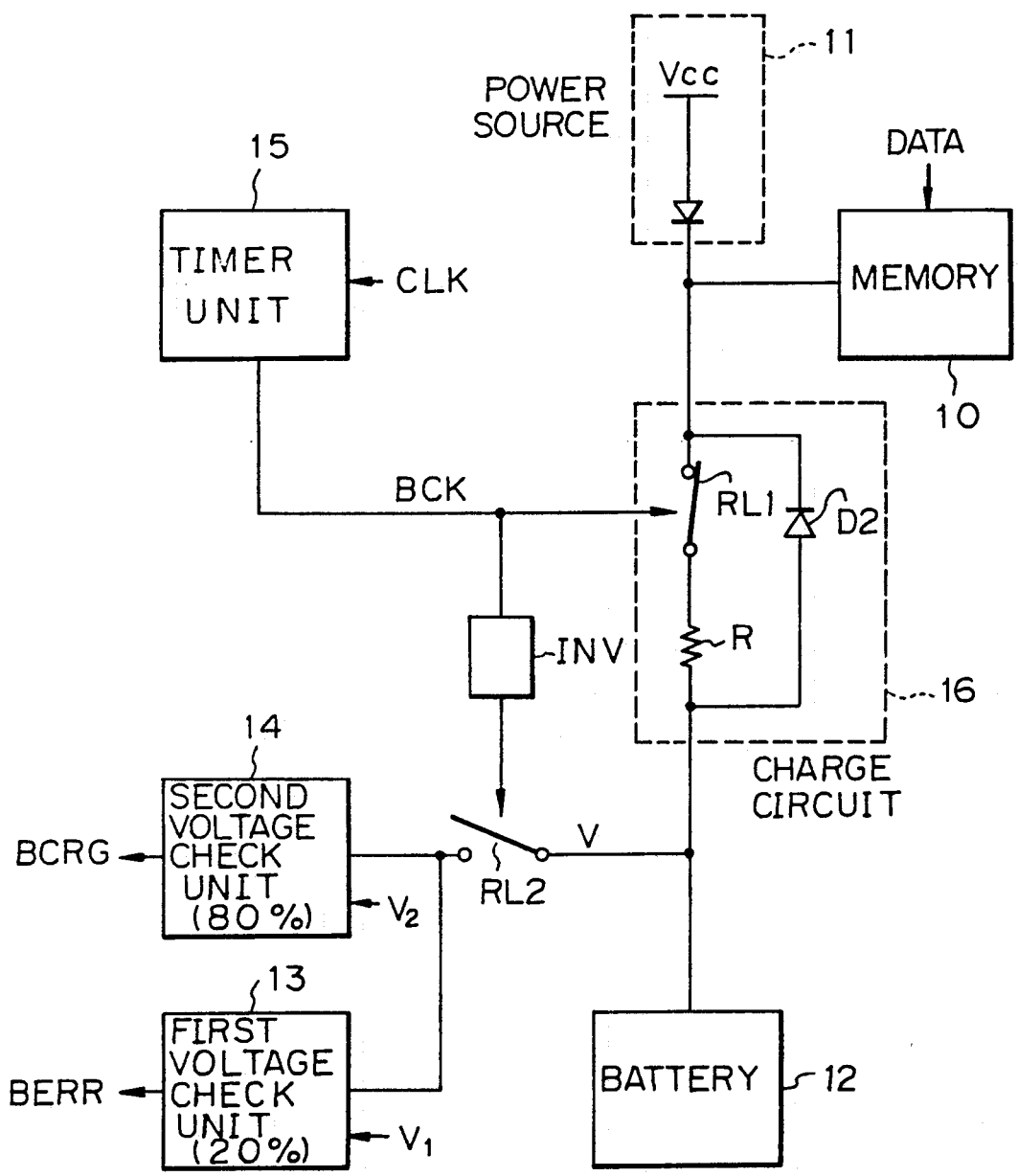
FIG. 3 is a schematic block diagram of a data protection system according to an embodiment of the present invention.

FIG. 3 is a schematic block diagram of a data protection system according to an embodiment of the present invention. In FIG. 3, reference number 11 denotes a power source for supplying a voltage Vcc to the memory 10, 15 denotes a timer unit for generating a battery check signal BCK at contact time intervals, 16 denotes a charge circuit for charging the battery 12 from the power source 11, and INV is inverting means. Further, RL1 and RL2 denote relays. These relays are closed when the low level signals are input thereto. Accordingly, when the battery check signal BCK is high, the relay RL1 is opened and the relay RL2 is closed. When the battery check signal BCK is low, the relay RL1 is closed and the relay RL2 is opened. Accordingly, when the battery check signal BCK is high, the relay RL2 is closed and the battery voltage V is checked by the first and second voltage check units 13 and 14. Meanwhile, when the battery check signal BCK is low, the relay RL1 is closed and the relay RL2 is opened. Accordingly, the battery 12 is charged from the power source 11 through the relay RL1 and the resistor R.

Figure 4:
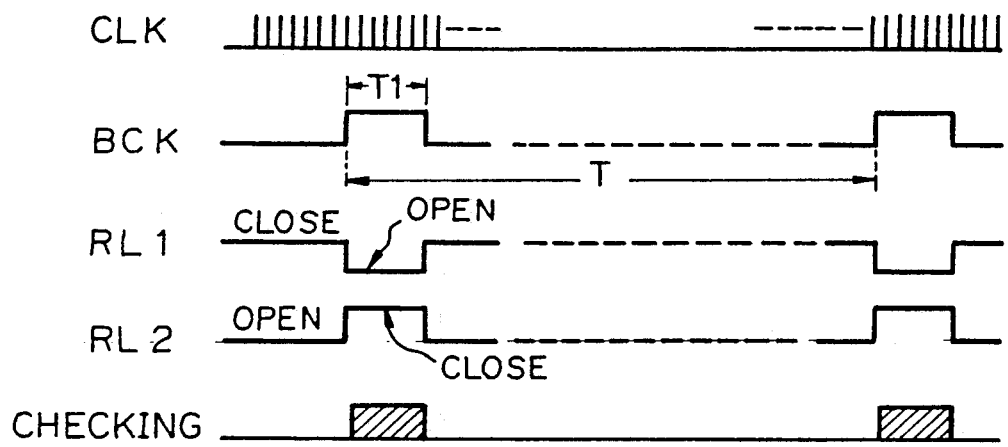
FIG. 4 is a timing chart for explaining a battery checking operation.

FIG. 4 is a timing chart for explaining a battery checking operation. The timer unit 15 operates in response to a clock signal CLK. Accordingly, the timer unit 15 counts the number of clock signals CLK and sets the battery check signal BCK to the high level during a constant time interval T1.

While checking the battery voltage, if the power source 11 is accidentally interrupted, the battery voltage can be supplied to the memory 10 through the diode D2.

For example, in the first voltage check unit 13, the first reference voltage V1 is set to 20% of the full charged voltage. In the second voltage check unit 14, the second reference voltage V2 is set to 80% of the full charged voltage. Accordingly, when the battery voltage V is lower than the first reference voltage V1, the first voltage check unit 13 generates the battery error signal BERR. In this case, it is necessary to charge the battery. When the battery voltage V lies between the first reference voltage V1 and the second reference voltage V2, the second voltage check unit 14 generates the battery checking signal BCRG. In this case, although the battery is in an insufficient charging state, it is not necessary to charge the battery. However, the memory 10 is disconnected from the data transfer route and the transfer mode of the data is changed to the write-through mode in which the external storage device 6 is directly accessed from the channel system.

Accordingly, either the battery check signal BERR or the battery charging signal BCRG is generated from the first or second voltage check unit, the memory 10 is disconnected from the device controller, and the transfer mode is changed to the write-through mode. Therefore, it is possible to protect the data stored in the memory 10 in an accidental power OFF which occurs before the data stored in the memory 10 has been transferred to the external storage device 6 (i.e., before the write-back mode). Meanwhile, when the battery is charged over the second reference voltage V2, the battery charging signal BCRG is turned OFF and the memory 10 is again connected to the channel system.

As explained above, since the battery voltage is periodically checked by the battery check signal BCK from the timer unit 15, the data stored in the memory 10 can be securely protected from an accidental power OFF.

Figure 5:
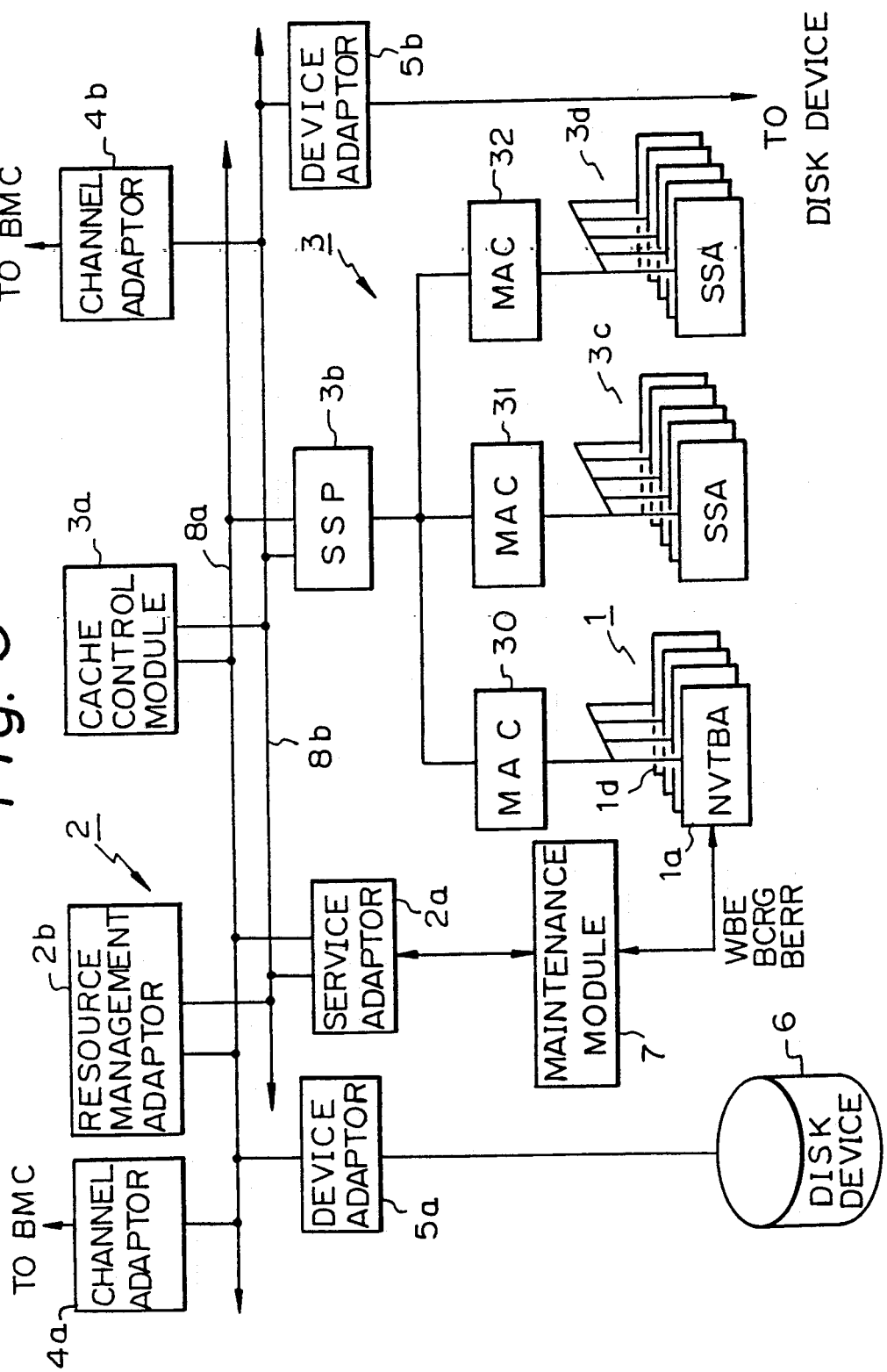
FIG. 5 is a schematic block diagram of a disk cache system applying the present invention.

FIG. 5 is a schematic block diagram of a device controller, for example, a disk cache system employing the present invention. A disk cache system is usually provided between a channel system and an external storage device, and is utilized for increasing the effective performance of the external storage device 6. That is, the disk cache system controls the data transfer between the channel and the external storage device using a cache memory module 3 or without using the cache memory module 3. Accordingly, the disk cache system is a type of file controller.

In FIG. 5, reference 2a denotes a service adaptor formed by, for example, a microprocessor, and provided for supervising each module or each adaptor, Reference number 3 denotes a cache memory module formed by a storage port 3b, memory access controllers (MAC) 30 to 32, a non-volatile memory array (NVTBA) 1, and volatile memories (SSA) 3c to 3d. 3a denotes a cache control module for managing the cache memory module 3.

Reference 2b denotes a resource management adaptor for managing the resources of the whole disk cache system
and for controlling connections among adaptors. 4a and 4b denote channel adaptors for connecting a block multiplexer channel (BMC) in the channel system, and for performing an interface control therebetween. The block multiplexer channel (BMC) is provided for transferring a plurality of data in a time-sharing operation for each block unit.

Reference 7 denotes a maintenance module for receiving the battery charging signal BCRG, the battery error signal BERR and the write-back enable signal WBE, and for informing these signals to the service adaptor 2a. 8a and 8b denote common buses for connecting the modules 3a and 3, and the adaptors 2a, 2b, 3a, 4a, 4b, 5a and 5b.

The cache memory module 3 is formed by, for example, the non-volatile type memory array 1 having 16 Mbytes, and DRAM (dynamic random access memory) arrays 3c and 3d each having 256 Mbyte. Each of DRAMs 3c and 3d stores data having a high reference frequency from the data stored in the external storage device 6.

Figure 6:
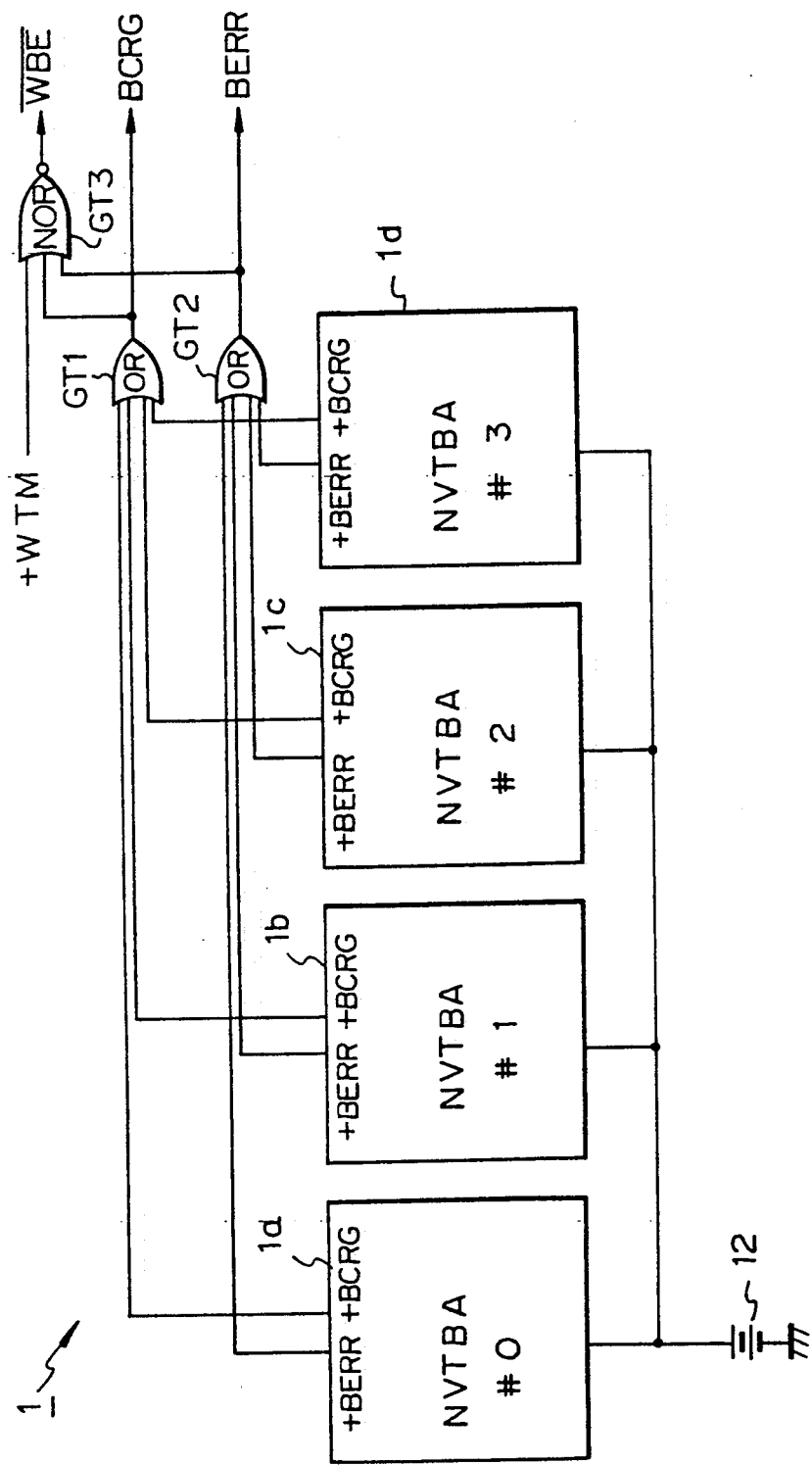
FIG. 6 is schematic block diagram of a non-volatile type memory array.

FIG. 6 is schematic block diagram of the non-volatile type memory array shown in FIG. 5. The non-volatile type memory array 1 is formed by four non-volatile memory cards 1a to 1d, a battery 12, OR gates GT1 and GT2 and a NOR gate GT3. The OR gate GT1 receives the battery charging signals +BCRG from each non-volatile memory 1a to 1d and outputs the battery charging signal BCRG. The OR gate GT2 receives the battery error signals +BERR from each non-volatile memory 1a to 1d and outputs the battery error signal BERR. The NOR gate GT3 receives the battery charging signal BCRG, the battery error signal BERR and the write-through mode signal WTM, and outputs an inverted write enable signal WBE.

Figure 7:
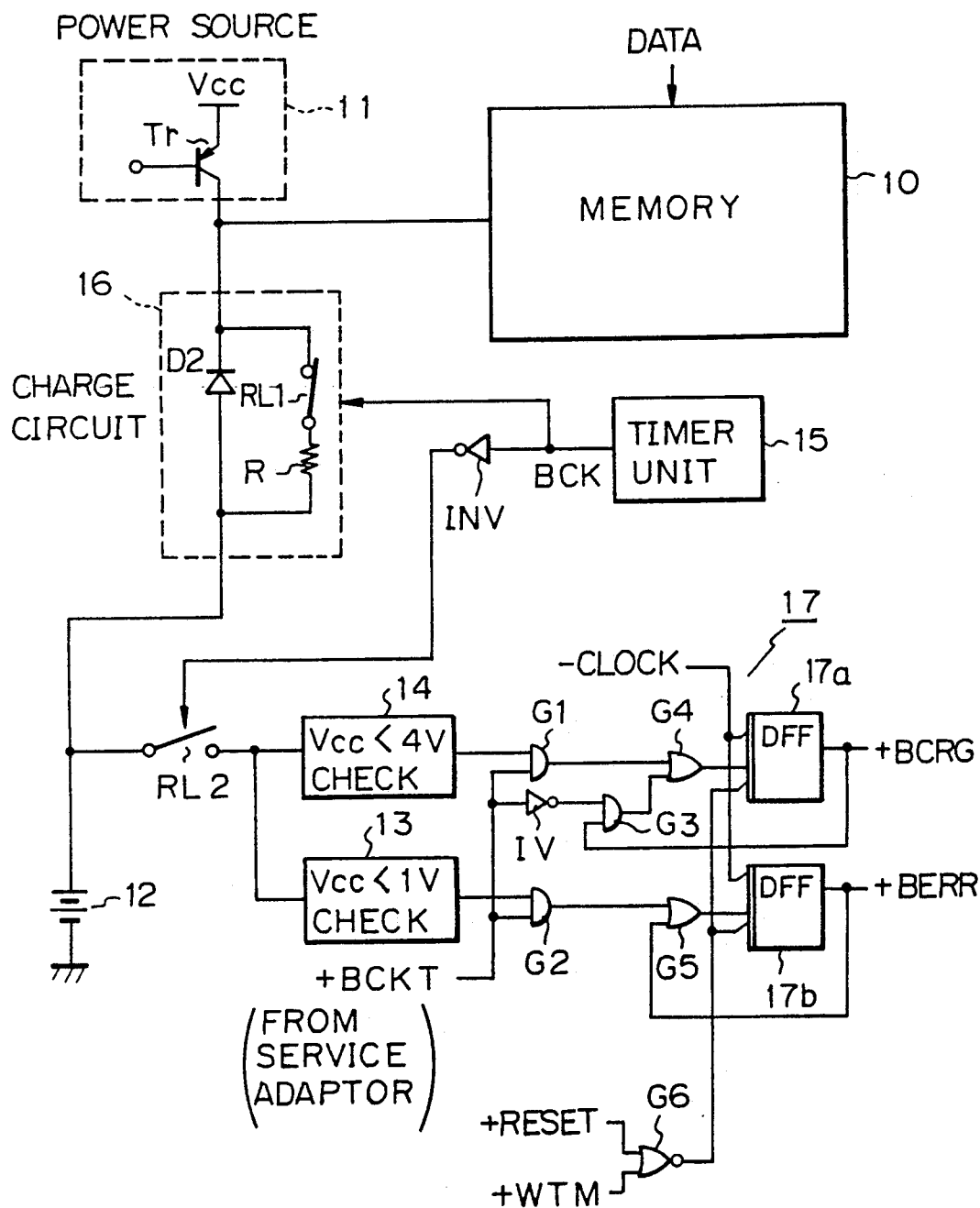
FIG. 7 is a detailed block diagram of a non-volatile type memory array.

FIG. 7 is a detailed block diagram of the non-volatile type memory card. Each non-volatile type memory card 1a to 1d is formed by a non-volatile memory, the power source 11, the charge circuit 16, the first and second voltage check circuits 13 and 14, and a signal output circuit 17.

The signal output circuit 17 comprises AND gates G1, G2 and G3, OR gates G4 and G5, a NOR gate G6, flip-flop circuits 17a and 17b, and an inverter IV. The AND gate G1 receives the battery check signal and the battery check timing signal BCKT. The AND gate G2 receives the battery error signal BERR and the battery check timing signal BCKT. The flip-flop circuit 17a sets the battery check signal BCRG and the flip-flop circuit 17b sets the battery error signal BERR. The NOR gate G6 receives the reset signal RESET and the write-through mode signal WTM, and sets the flip-flop circuits 17a and 17b to the reset state. The transistor Tr of the power source 11 is turned OFF when the power source voltage Vcc falls under 4.2 (v).

An inverter INV inverts the battery check signal BCK. Accordingly, as explained in FIG. 3, when the battery check signal BCK is high, the relay RL1 is opened and the relay RL2 is closed so that the battery voltage V can be checked by the first and second voltage check units 13 and 14.

In the disk cache system shown in FIG. 5, the non-volatile type memory 1 is used as a part of the cache memory module 3. Accordingly, when the cache memory module 3 is not used, the data transfer between the channel and the disk device 6 is performed as follows. This is called "write-through mode" as explained above.

In the write-through mode, the write data from the channel is transferred from the BMC (block multiplexer channel) channel to the disk device 6 through the channel adaptor 4a and the device adaptor 5a. The data stored in the disk device 6 is read out from the disk device 6 to the BMC channel through the device adaptor 5a and the channel adaptor 4a. This route is shown by a dotted line in FIG. 10. The cache memory module 3 is not used in this data transfer route.

When the cache memory module 3 is used, the data having a high reference frequency in the disk device 6 is stored in the cache memory module 3. Accordingly, the write data is transferred from the BMC channel to cache memory module 3 through the channel adaptor 4a and the storage port 3b. At the same time, the write data is transferred to the disk device 6 through the device adaptor 5a. Meanwhile, the read data is transferred from the cache memory module 3 to the BMC channel through the channel adaptor 4a.

When the write-back mode is designated as being used by the cache memory module 3, the write data from the BMC channel is stored in the non-volatile type memory 1 and is simultaneously stored in the volatile type memories 3c and 3d. At this time when the write operation to the non-volatile memory 1 is completed, the channel adaptor 4a sends a "DEVICE END" signal which indicates completion of the data transfer to the BMC channel. After the BMC channel is informed of the completion, the write data stored in the non-volatile type memory 1 is transferred to the disk device 6 through the device adaptor 5a. Accordingly, it is possible to raise the throughput between the channel and the device because the write data is temporarily stored in the non-volatile type memory 1. As is obvious from the above, since the BMC channel is always informed of the completion of the transfer the write data stored in the non-volatile type memory 1 is always written into the disk device 6 through the device adaptor 5a.

Accordingly, if the power source is accidentally interrupted before the write-back operation, it is necessary to change the transfer mode to the write-through mode in order to access the data from the disk device 6.

Figure 9:
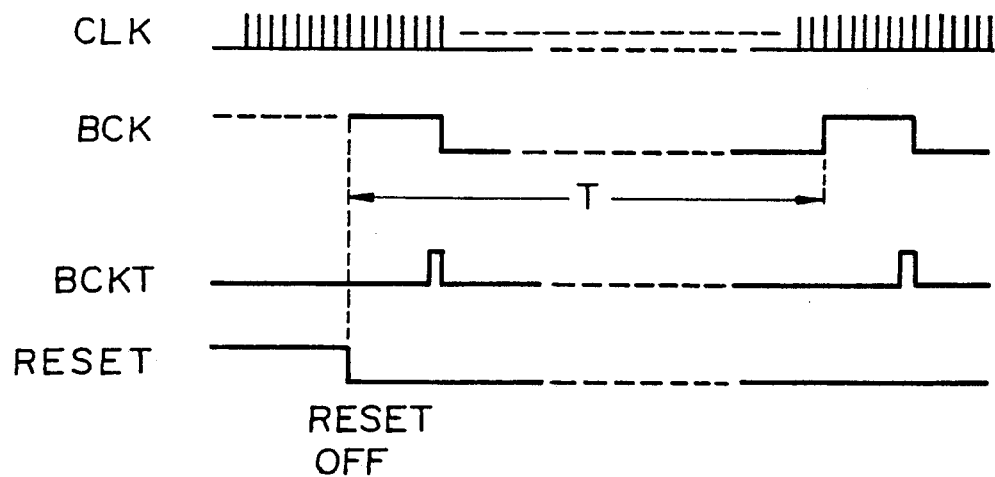
FIG. 9 is a timing, chart for explaining a battery checking operation according to another embodiment of the present invention.

FIG. 8 is a flowchart for explaining the operation of the structure shown in FIGS. 5, 6, and 7. FIG. 9 is a timing chart for explaining a battery checking operation of another embodiment.

Basically, the battery check is performed with two timings, i.e., the timing after the reset state is released and the timing of once per one hour for about 0.45 second. The state of the battery voltage is output to the service adaptor 2a through the maintenance module 7, stored in the service adaptor 2a, and input to the cache control module 3a. When the channel adaptor 4a or the device adaptor 5a performs the cache operation, the resource management adaptor 2b determines either the write-back mode or the write-through mode based on the information of the battery state obtained from the cache control module 3a.

In the first step ①  of FIG. 8, the commands "RESET OFF" and "WTMSW OFF" are generated from the operation panel in the maintenance module 7. That is, the reset state is released and the write-through mode switch is turned OFF. The transfer mode is set to the write-back mode. The service adaptor 2a starts the timer unit 15 of the non-volatile type memory 1, sets the battery check signal BCK to the high level during the 0.45 second period. The battery voltage is checked by the first and second voltage check units 13 and 14 as explained above during this time interval (TIMER A: OUT).

In step ②, the battery error signal BERR and the battery charging signal BCRG are set in the flip-flop circuits 17a and 17b of the signal output circuit 17 (see, FIG. 7) in synchronization with the battery check timing signal BCKT from the service adaptor 2a. The battery error signal +BERR and the battery charging signal +BCRG are transferred to the service adaptor 2a through the OR gates GT1 and GT2 and the maintenance module 7 with the write-back enable signal WBE.

The service adaptor 2a inputs these signals to the cache control module 3a. The cache control module 3a determines whether or not the battery error signal BERR is valid. When the battery voltage is lower than 20% of the full charge voltage, the cache control module 3a turns ON the write-through mode (WTM ON) and the cache memory module 3 is disconnected from the device controller. Further, "ERROR" is displayed on the operation panel of the maintenance module 7 through the service adaptor, 2a. Still further, the cache control module 3a inputs the write-through mode to the resource management adaptor 2b.

In this case, the operator can recognize the state of the battery based on the display or the information from the firmware. Further, the operator can change the defective battery to a normal one and the flip-flop circuits 17a and 17b can be returned to the initial state by operating the write-mode switch as a recovery operation.

In step ③, when the battery error is invalid, the cache control module 3a determines whether or not the battery charging signal BCRG is valid. When the battery charging signal BCRG is invalid, the write-through mode is turned OFF (WTM OFF) and the write-back mode is activated since the battery voltage exceeds 80% of the full charge voltage. Further, the display of "CHARGING", of the operation panel is turned ON (CHARGING ON).

In step ④, when the battery charging signal BCRG is valid, the cache control module 3a determines the write-through mode (WTM ON) and the cache memory module 3 is disconnected from the device controller. Further, the display of "CHARGING" is turned OFF. If data exists in the non-volatile type memory 1, the cache control module 3a enters an "emergency write-back mode" and commands the cache memory module 3 to transfer the user data to the disk device 6.

In step ⑤, the predetermined hour T (one hour) has elapsed on the timer unit 15 (TIMER B: OUT), and the battery check is repeated by the same steps ①  and ②.

Briefly, as shown in FIG. 10, when data exists in the non-volatile type memory 3 in the write-back mode, the user data stored in the non-volatile type memory 3 is written to the disk device 6 based on the emergency write-back mode when the battery error signal BERR or the battery charging signal BCRG are generated. In this case, when the battery error signal BERR is generated, the transfer mode is set to the write-through mode. When the error is revised, the transfer mode is set to the write-back mode from the operation panel. Meanwhile, when the battery charging signal BCRG is generated, the transfer mode is changed to the write-through mode. However, when the battery charge is completed, the transfer mode is automatically set back to the write-back mode. The battery check circuit is provided in each non-volatile memory card so that it is possible to check the battery voltage even if one voltage check circuit stops functioning.

Although the above explanations are made in relation to the disk cache system shown in FIG. 5, it is possible to apply the present invention to other systems. Further, although the static RAM is used as the non-volatile memory, it is possible to apply another known non-volatile memory which can be used in the non-volatile state by the back-up operation. Still further, it is possible to provide a plurality of voltage check circuits for performing a more precise battery check operation.

I claim:

1. A data protection system for protecting data stored in a memory having a memory unit for storing the data, a power unit for supplying power to the memory unit, and a battery charged by the power source and supplying a battery voltage to the memory unit when the power source is accidentally interrupted, said data protection system comprising:

first voltage check means, connected to the battery, for comparing the battery voltage with a first reference voltage and generating a battery error signal when the battery voltage is lower than the first reference voltage; and second voltage check means, connected to the battery for comparing the battery voltage with a second reference voltage which is higher than the first reference voltage and generating a battery charging signal when the battery voltage lies between the first reference voltage and the second reference voltage.

2. A data protection system as claimed in claim 1 wherein data protection system further comprises timer means, operatively connected to said first and second voltage check means, for generating a battery check signal at constant time intervals.

3. A data protection system for protecting data stored in a memory provided in a device controller, and having a memory unit for temporarily storing the data, a power source unit for supplying power to the memory unit, and a battery charged by the power source and supplying a battery voltage to the memory unit when the power source is accidentally interrupted, said data protection system comprising:

first voltage check means, connected to the battery, for comparing the battery voltage with a first reference voltage and generating a battery error signal when the battery voltage is lower than the first reference voltage;

second voltage check means, connected to the battery for comparing the battery voltage with a second reference voltage which is higher than the first reference voltage and generating a battery charging signal when the battery voltage lies between the first reference voltage and the second reference voltage; and control means for disconnecting the memory from the device controller when the battery error signal or the battery charging signal is input thereto, said control means informing firmware of a battery error based on the battery error signal.

4. A data protection system as claimed in claim 3, where said data protection system further comprises a timer means operatively connected to said first and second voltage check means, and generating a battery check signal at constant time intervals.

5. A data protection system for protecting data stored in a memory in a data processing system having at least a channel system, a device controller and an external storage device, said data protection system comprising:

a memory provided in the device controller for receiving a power source voltage from a power source, and temporarily storing data to be transferred;

a battery, connected to the power source and said memory, charged by the power source when the power source is normal, and supplying a battery voltage to said memory when the power source is accidentally interrupted;

first voltage check means, connected to said battery, for comparing the battery voltage with a first reference voltage and generating a battery error signal when the battery voltage is lower than the first reference voltage;

second voltage check means, connected to said battery, for comparing the battery voltage with a second reference voltage and generating a battery charging signal when the battery voltage lies between the first reference voltage and the second reference voltage; and control means for selectively determining two modes, one mode being a write-back mode for transferring data from said memory to said external storage device after the data is stored in said memory, and a write-through mode for directly transferring data from said channel system directly to said external storage device when one or both of the battery error signal and the battery charging signal is input thereto.

6. A data protection system as claimed in claim 5, wherein said data protection system further comprises timer means for outputting a battery check signal based on a predetermined clock signal.

7. A data protection system as claimed in claim 6, wherein the battery check signal is output from said timer means at constant time intervals.

8. A data protection system as claimed in claim 5, wherein said memory is disconnected from said device controller during the write-through mode.

9. A data protection system as claimed in claim 5, wherein said memory is a non-volatile type memory.

10. A data protection method for a data protection system including a power source and a battery for protecting data stored in a memory, said method comprising the steps of:

(a) turning OFF a reset and write-through mode switch;

(b) checking a battery voltage at a first timing;

(c) checking the battery voltage at a second timing;

(d) comparing, the battery voltage at either of the first or second timings with first and second reference voltages, the second reference voltage being higher than the first reference voltage; and (e) generating a battery error signal or a battery charging signal, in accordance with the result of the comparison.

* * * * *

UNITED STATES PATENT AND TRADEMARK OFFICE
CERTIFICATE OF CORRECTION

PATENT NO. : 5,007,027
DATED : APRIL 9, 1991
INVENTOR(S) : HIROYUKI SHIMOI

It is certified that error appears in the above-identified patent and that said Letters Patent is hereby corrected as shown below:

TITLE PAGE: [56] References Cited, please delete all U.S. Patent Documents as listed, and insert the following references, in which a portion were inadvertently omitted from the Patent Office:

```
--4,506,323   3/1985   Pusic et al. ......... 364/200
  4,547,629  10/1985   Corless .............. 365/229
  4,707,618  11/1987   Haas ................. 307/64
  4,712,196  12/1987   Uesugi ............... 365/229
  4,777,626  10/1988   Matsushita et al...... 365/229
```

FOREIGN PATENT DOCUMENTS

```
56-103722   8/1981   Japan  .
58-146099   8/1983   Japan  .
0166341     1/1986   Europe .
62-008212   1/1987   Japan  .--.
```

Signed and Sealed this

Eleventh Day of January, 1994

Attest:

BRUCE LEHMAN

*Attesting Officer*       *Commissioner of Patents and Trademarks*